United States Patent
Madocks

(10) Patent No.: US 7,327,089 B2
(45) Date of Patent: Feb. 5, 2008

(54) BEAM PLASMA SOURCE

(75) Inventor: John E. Madocks, Tucson, AZ (US)

(73) Assignee: Applied Process Technologies, Inc., Tucson, AZ (US)

(*) Notice: Subject to any disclaimer, the term of this patent is extended or adjusted under 35 U.S.C. 154(b) by 0 days.

(21) Appl. No.: 10/528,386

(22) PCT Filed: Sep. 19, 2003

(86) PCT No.: PCT/US03/29204

§ 371 (c)(1),
(2), (4) Date: Dec. 23, 2005

(87) PCT Pub. No.: WO2004/027825

PCT Pub. Date: Apr. 1, 2004

(65) Prior Publication Data

US 2006/0152162 A1    Jul. 13, 2006

(51) Int. Cl.
*H01J 7/24* (2006.01)
(52) U.S. Cl. ............... 315/111.21; 315/111.41; 315/111.71; 118/723 DC; 118/723 MR; 204/298.19; 204/298.37
(58) Field of Classification Search ........... 204/192.1, 204/192.11, 192.12, 298.16, 298.19, 298.36, 204/298.37; 118/723 DC, 723 E, 723 ER, 118/726, 723 MR; 315/111.21, 111.41, 111.71, 315/111.91
See application file for complete search history.

(56) References Cited

U.S. PATENT DOCUMENTS

| | | | |
|---|---|---|---|
| 3,878,085 A | 4/1975 | Corbani | |
| 4,868,003 A | 9/1989 | Temple et al. | |
| 4,871,918 A | 10/1989 | Miljevic | |
| 4,915,805 A | 4/1990 | Rust | |
| 4,933,057 A | 6/1990 | Sebastiano et al. | |
| 4,941,430 A | 7/1990 | Watanabe et al. | |

(Continued)

FOREIGN PATENT DOCUMENTS

WO     WO 2004/031441        4/2004

OTHER PUBLICATIONS

B. Window and N. Savvides, "Unbalanced dc magnetrons as sources of high ion fluxes", Journal of Vacuum Science and Technology A, vol. 4 (3), May/Jun. 1986.

(Continued)

*Primary Examiner*—Haissa Philogene
(74) *Attorney, Agent, or Firm*—Lawrence R. Oremland, P.C.

(57) ABSTRACT

A plasma source which includes a discharge cavity having a first width, where that discharge cavity includes a top portion, a wall portion, and a nozzle disposed on the top portion and extending outwardly therefrom, where the nozzle is formed to include an aperture extending through the top portion and into the discharge cavity, wherein the aperture has a second width, where the second width is less than the first width. The plasma source further includes a power supply, a conduit disposed in the discharge cavity for introducing an ionizable gas therein, and at least one cathode electrode connected to the power supply, where that cathode electrode is capable of supporting at least one magnetron discharge region within the discharge cavity. The plasma source further includes a plurality of magnets disposed adjacent the wall portion, where that plurality of magnets create a null magnetic field point within the discharge cavity.

27 Claims, 12 Drawing Sheets

U.S. PATENT DOCUMENTS

| | | |
|---|---|---|
| 5,069,770 A | 12/1991 | Glocker |
| 5,073,245 A | 12/1991 | Hedgcoth |
| 5,133,850 A | 7/1992 | Kukla et al. |
| 5,334,302 A | 8/1994 | Kubo et al. |
| 5,482,611 A | 1/1996 | Helmer et al. |
| 5,614,248 A | 3/1997 | Schiller et al. |
| 5,656,141 A | 8/1997 | Betz et al. |
| 5,728,280 A | 3/1998 | Scherer |
| 5,838,120 A | 11/1998 | Semenkin et al. |
| 5,904,952 A | 5/1999 | Lopata et al. |
| 5,908,602 A | 6/1999 | Bardos et al. |
| 6,103,074 A | 8/2000 | Khominich |
| 6,137,231 A * | 10/2000 | Anders et al. ........... 315/111.21 |
| 6,444,100 B1 | 9/2002 | McLeod |
| 6,444,945 B1 | 9/2002 | Maschwitz et al. |
| 6,446,572 B1 * | 9/2002 | Brcka ................... 118/723 ER |
| 6,734,434 B1 | 5/2004 | Sainty |
| 6,911,779 B2 * | 6/2005 | Madocks ................ 315/111.21 |
| 6,919,672 B2 * | 7/2005 | Madocks .................. 313/359.1 |
| 7,038,389 B2 * | 5/2006 | Madocks ................ 315/111.21 |
| 2002/0153103 A1 | 10/2002 | Madocks |
| 2003/0230961 A1 | 12/2003 | Madocks |
| 2004/0074443 A1 | 4/2004 | Madocks |
| 2004/0135485 A1 | 7/2004 | Madocks |
| 2004/0149574 A1 | 8/2004 | Madocks |
| 2004/0155592 A1 | 8/2004 | Madocks |
| 2004/0217713 A1 | 11/2004 | Madocks |
| 2005/0247885 A1 | 11/2005 | Madocks |
| 2006/0000705 A1 | 1/2006 | Hartig et al. |

OTHER PUBLICATIONS

B. Window and G.L. Harding, "Ion-assisting magnetron sources: Principles and uses", Journal of Vacuum Science and Technology A, vol. 8 (3), May/Jun. 1990.

B. Window and N. Savvides, "Charged particle fluxes from planar magnetron sputtering sources", Journal of Vacuum Science and Technology A, vol. 4 (2), Mar./Apr. 1986.

G. Este and W.D. Westwood, "A quasi-direct-current sputtering technique for the deposition of dielectrics at enhanced rates", J. Vac. Sci. Technol. A, vol. 6 (3), May/Jun. 1988.

M. Scherer, J. Schmitt, R. Latz and M. Schanz, "Reactive alternating current magnetron sputtering of dielectric layers" J. Vac. Sci. Technol. A, vol. 10(4) Jul./Aug. 1992.

* cited by examiner

BEAM PLASMA SOURCE

FIELD OF THE INVENTION

The present invention relates to plasma and ion sources used for industrial processes such as plasma treatment, plasma enhanced chemical vapor deposition (PECVD) and plasma etching and to electric propulsion devices for space applications.

BACKGROUND OF THE INVENTION

Plasma and ion sources are usefully applied in a number of processes including: Plasma enhanced chemical vapor deposition (PECVD), reactive ion etching, plasma surface modification and cleaning, increasing the density of evaporated or sputtered films and assisting a reactive evaporation or sputtering process. Of growing interest is the application of these processes to larger substrates such as flexible webs, plasma televisions and architectural glass.

Several plasma and ion sources are commercially available and many more have been disclosed. Commercially available plasma and ion sources include: Hollow cathode plasma sources, gridded ion sources, end hall ion sources, closed drift type ion sources including extended acceleration channel and anode layer types, and impeded anode types like the Leybold Optics' Advanced Plasma Source. While successfully applied to small substrate applications like semiconductors or optical filters, they are less effective in processing wide substrate applications. This is primarily due to the use of point electron sources for beam creation and neutralization rather than uniform, linear electron sources. Point electron source technologies such as filaments, heated low work function materials and hollow cathodes are difficult to extend linearly. Consequently, the ion and plasma sources that rely on these point electron sources have difficulty producing the uniform linear beams when utilizing large area substrates.

Therefore, there is a need for a uniform, linear plasma or ion source that can be readily extended to wide substrates. This ideal linear source should not require a delicate or expensive electron source, such as filaments or LaB6, and should be capable of operating over a wide process pressure range. This source should also be physically compact, economical, and should produce a dense, efficient plasma beam.

Prior art sources generally utilize one of two technology categories. One such category comprises magnetron sputtering sources, and more specifically unbalanced magnetrons and hollow cathode sputtering sources. The second such category comprises plasma and ion sources.

Unbalanced Magnetron Sources

Window and Savvides presented the concept of unbalanced magnetron ("UBM") sputter cathodes in several published articles. In these articles, the type II unbalanced magnetron is disclosed with its ability to ionize the sputtered flux from the cathode. The fundamental operating principles of the null magnetic field region and mirror magnetic confinement electron trapping are taught.

FIG. 12 shows a planar target type II UBM as presented by Window and Savvides. Window and Harding later disclosed a type II UBM without a central magnetic material or high permeability pole. In FIG. 12, magnets 200 are configured around the periphery of a rectangular or round shunt plate 201. Central soft iron pole 207 is located in the center of the shunt plate. Because of the 'unbalanced' nature of the magnetic arrangement, a null field point 203 is created above magnetron trap 205 and strengthening field lines above the null point produce a mirror confinement region 208. In operation, magnetron plasma 204 sputters the target 206. Electrons leaving the magnetron plasma are trapped in the mirror containment region 208 creating a second visible plasma region.

As presented in the literature, the mirror plasma region ionizes a significant portion of the sputter flux from the target. The plasma 208 generated in the mirror region also projects out to the substrate 209 and usefully bombards the growing sputtered film. Plasma 208 can be used for plasma processes such as PECVD, plasma treatment etc. While finding use in these plasma processes, the sputtered flux from the target 206 is not always welcome, the UBM must operate in the mTorr range typical for magnetron sputtering and, for PECVD applications, the exposed target 206 is quickly contaminated by condensing PECVD constituents.

Hollow Cathode Sputter Sources

The term Hollow Cathode has been used to describe a variety of sputter sources in the prior art. U.S. Pat. No. 4,915,805 discloses a hollow cathode confined magnetron with the substrate passing through the center of the cavity. U.S. Pat. No. 4,933,057 discloses a hollow cathode configured magnetron with an anode positioned opposite from the opening into the process chamber. The anode in this position will allow electrons to reach the anode without having to pass out of the discharge cavity first. No gas is introduced into the discharge cavity separate from the opening to the process chamber.

U.S. Pat. No. 5,073,245 teaches a sputter source in a cavity separate from the process chamber. The magnetic field is along the axis of the cavity cylinder and a magnetron type containment region is reported to be created around the inside of the cavity cylinder walls. The opening to the process chamber creates a discontinuity in the magnetron racetrack. Anodes are located inside the cavity, at each end. U.S. Pat. No. 5,334,302 discloses a sputtering apparatus comprising multiple magnetron cathode cavities. Process gas is introduced into the base of each cavity. The cavities are open to the process chamber.

U.S. Pat. No. 5,482,611 discloses an unbalanced magnetron sputter cathode with a cup-shaped or annular cathode. A null magnetic field point is produced adjacent to the cathode opening. The discharge cavity is open to the process chamber. In FIG. 6 of the '611 patent a separate microwave applicator is fitted over the cathode opening. Though separate from the cathode, the applicator opening dimensions are equal to or larger than the cathode cavity. In one embodiment process gas is introduced into the cavity at the base of the cavity opposite the process chamber opening.

U.S. Pat. No. 5,908,692 teaches a linear arc discharge source. The discharge cavity does not include a magnetron confined plasma region and the discharge cavity opening is exposed to the process chamber.

U.S. Pat. No. 6,444,100 discloses a box shaped hollow cathode sputter source. The bottom of the box is either electrically floating or connected to the cathode. The box is open to the process chamber and process gas is not introduced into the box other than via the process chamber opening.

Other Plasma Sources

U.S. Pat. No. 6,444,945 teaches a bipolar plasma source, plasma sheet source, and effusion cell utilizing a bipolar plasma source. In the preferred embodiments a magnetron cathode plasma is not created and the hollow cathode cavity opening is exposed to the process chamber. U.S. Pat. No. 4,871,918 discloses a hollow-anode ion-electron source comprising a discharge cavity with a reduced dimension opening conduit to the process chamber. There is no magnetron confined region or null magnetic field point within the discharge cavity.

U.S. Pat. No. 6,103,074 teaches a cathode arc vapor deposition method and apparatus that implements a cusp magnet field. There is no magnetron confined region inside the discharge cavity and the cavity is open to the process chamber.

SUMMARY OF THE INVENTION

Applicant's invention includes a plasma source, Applicant's plasma source includes a discharge cavity having a first width, where that discharge cavity includes a top portion, a wall portion, and a nozzle disposed on the top portion and extending outwardly therefrom, where the nozzle is formed to include an aperture extending through the top portion and into the discharge cavity, wherein the aperture has a second width, where the second width is less than said first width.

Applicant's plasma source further includes a conduit disposed in said discharge cavity for introducing an ionizable gas into the discharge cavity, and at least one cathode electrode connected to a power supply, where that cathode electrode is capable of supporting at least one magnetron discharge region within the discharge cavity. Applicant's plasma source further includes a plurality of magnets disposed adjacent the wall portion, where that plurality of magnets create a null magnetic field point within the discharge cavity.

DETAILED DESCRIPTION OF THE PRESENTLY PREFERRED

Figure 1:
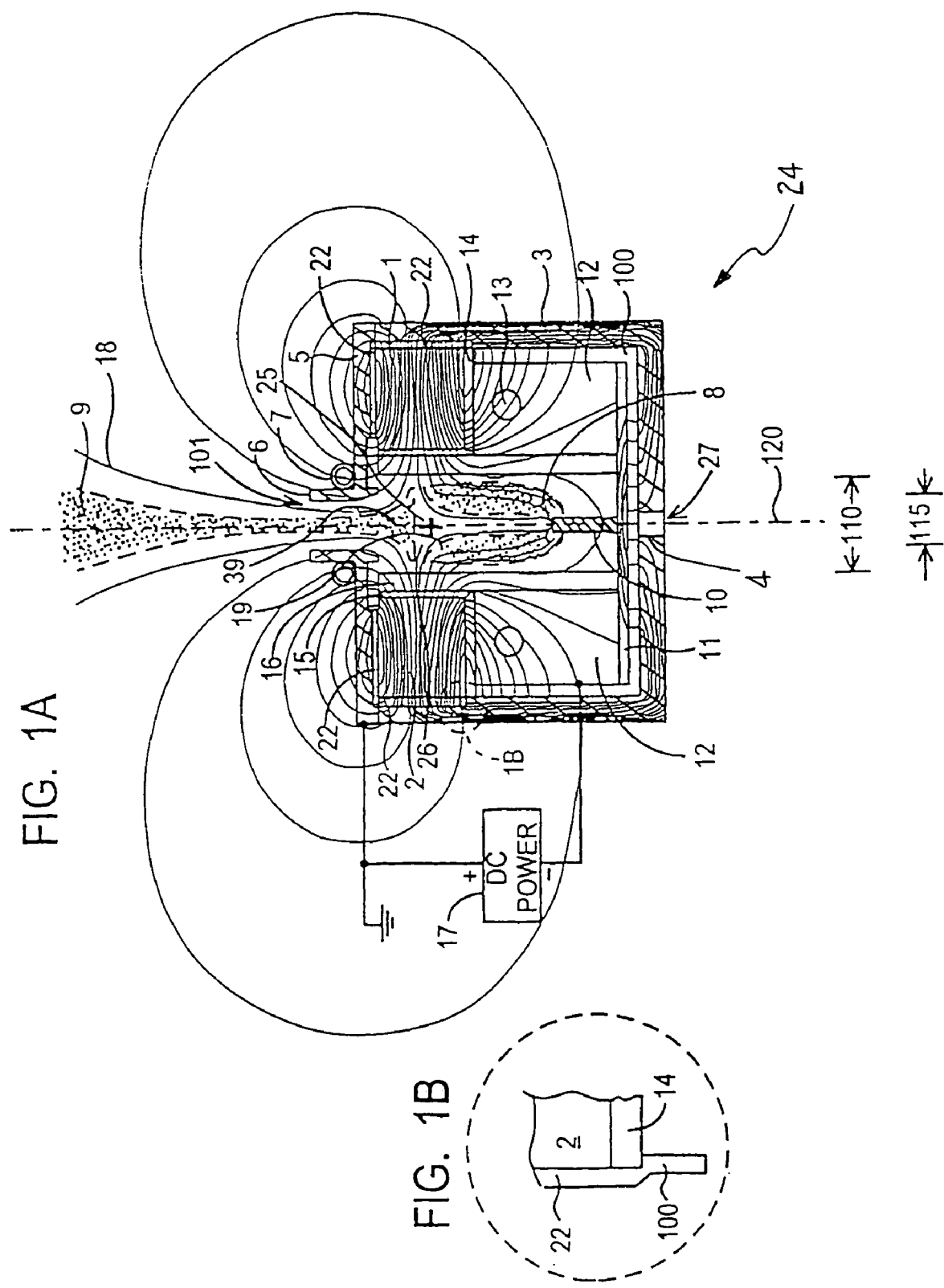
FIGS. 1A and 1B show a section view of Applicant's beam source.

FIG. 1 shows a section view of beam source 24 producing a beam of dense plasma 9 projecting outwardly from nozzle 6. Aperture 101 extends through nozzle 6 into discharge cavity 26. Discharge cavity 26 has a first width 110. Aperture 101 has a second width 115, where the second width 115 is less than the first width 110. Center-line 120 comprises the middle of first width 110.

Discharge cavity 26 comprises a parallelepiped having a rectangular cross section. In these embodiments, the first width 110 comprises the width of the longer side of that rectangular cross section. In certain embodiments, discharge cavity 26 a parallelepiped having a square cross section. In these embodiments, the first width 110 comprises the width of one side of that square cross section. In certain embodiments, discharge cavity 26 comprises a cylinder having a circular cross section. In these embodiments, the first width 110 comprises the diameter of that circular cross section.

In certain embodiments, aperture 101 has a rectangular cross section. In these embodiments, second width 115 comprises the width of the longer side of that rectangular cross section. In certain embodiments, aperture 101 has a square cross section. In these embodiments, second width 115 comprises the width of one side of that square cross section. In certain embodiments, aperture 101 has a circular cross section. In these embodiments, second width 115 comprises the diameter of that circular cross section.

Source 24 is disposed within a process chamber, not shown, where that process chamber is maintained at a reduced pressure. Magnets 1 and 2 are disposed facing each other with the south poles supported by mild steel shunt 3. By "facing each other," Applicant means that the pole of magnet 1 having a first magnetic polarity has a facing relationship with the pole of magnet 2 having that same magnetic polarity. The magnets 1 and 2 produce a cusp magnetic field composed of outwardly directed field lines 18 and inwardly directed lines 19. The inward lines 19 pass through insulator 15 and liner 16 to center shunt 10. The cusp magnetic field creates a null magnetic field point 25 inside discharge cavity 26. In certain embodiments, null magnetic field point 25 is located along center-line 120. Along with end magnets not shown and magnets 1 and 2, the cusp fields 18 and 19 create endless electron traps in regions 9 and 8. Shunt 10 is connected to shunt 11, and both are made of mild steel. Liner 16 is brazed to block 12 to improve heat transfer.

Block 12 is water cooled via holes 13 in combination with associated piping not shown. Shunt 11 is fastened to block 12. The assembly of the liner 16, block 12 and shunts 10 and 11 form one electrode of the source. The second electrode is formed by shunt box 3 and cover 5. The magnets are ceramic type isolated from liner 16 and block 12 by insulators 14 and 15. In certain embodiments, insulators 14 and 15 are formed from one or more fluoropolymers. In other embodiments, insulators 14 and 15 are formed from an electrically insulating ceramic material.

Gap 100 separates separate box 3 from block 12 and shunt 11 to eliminate plasma in the gap. In certain embodiments, gap 100 is about 3 mm. Gas 27 is introduced into the source through port 4 in box 3. The gas 27 travels around block 12 via gap 100 between box 3 and block 12. Gas 27 then flows through a plurality of grooves 22 disposed in box 3 and cover 5. Gas 27 is introduced into discharge cavity 26 between cover 5 and liner 16. Cover 5 includes a nozzle 6 through which the gas 27 flows into the process chamber. The cover 5 and nozzle 6 are water cooled with brazed-on tubing 7. One side of power supply 17 is connected to cover 5, box 3, and to chamber ground.

The other pole of power supply 17 is connected to internal block assembly 12, and thereby liner 16 and shunts 10 and 11. The electrical connection to block 12 is made to the water cooling tubing exiting box 3 (tubing not shown). In certain embodiments, liner 16 comprises a cathode electrode. In certain embodiments, liner 16 is formed from materials having a secondary electron emission coefficient 6 of about 1 or more.

In certain embodiments, power supply 17 comprises a standard sputter magnetron type. In certain embodiments, power supply 17 comprises a pulsed DC supply. In certain embodiments, power supply 17 comprises a mid-frequency AC supply. In certain embodiments, power supply 17 comprises an RF supply.

In the illustrated embodiment of FIG. 1, a DC supply 17 is used with the negative electrode connected to block 12. When gas 27 is introduced into discharge cavity 26 and power supply 17 is turned on, a plasma is ignited in regions 8 and 9 of the source. Region 8 is an endless Hall current contained plasma extending the length of the source. The two lobes of region 8, as seen in section view FIG. 1, appear as an extended donut of plasma when the inside of the operating source is viewed. This region 8 is created when the electric field from cover 5 penetrates down past magnetic field lines 19 inside the source. As electrons attempt to follow these electric field lines they are restricted by magnetic field lines 19.

Electrons cannot escape from the electrostatically and magnetically confined region made by electron containing liner 16 and shunt 10 surfaces and field lines 19. The result is a confined plasma region 8 inside discharge cavity 26. Region 9 is created and sustained as a result of plasma 8. By the arrangement of magnetic field lines 18, cover 5 and nozzle 6, electrons created by plasma 8 are prevented from reaching the cover 5 and nozzle 6 anode electrode. Field lines 18 pass outwardly from liner 16, converge, and pass outwardly through nozzle 6.

Because electrons cannot cross magnetic field lines, the electric circuit between cover 5, nozzle 6 and plasma 8 can only be completed by the electrons exiting through nozzle 6 and passing out of the magnetic field 18 containment region. Plasma 9 is created because, when electrons attempt to escape along magnetic field lines 18 through the nozzle 6, they are confronted with a magnetic mirror as field lines 18 converge in nozzle 6. This mirror region reflects a portion of the electrons and creates a second containment region 39 within plasma 9.

Region 39 is again a closed drift magnetic bottle as electrons move in a cyclodial motion down to one end of the source and back to the other. In addition to the electron escape path, nozzle 6 also forms the only escape path for gas 27 flowing from discharge cavity 26 into the process chamber. The process gas 27 is forced through plasma region 39 where a high percentage of gas 27 is ionized prior to exiting nozzle 6. The confluence of gas 27 and electrons in region 39 creates a dense plasma 9 that extends outwardly from nozzle 6 into the process chamber. When the source 24 is viewed in operation, it appears that plasma 39 and plasma 9 comprise a single plasma. The internal diameter of nozzle 6 is smaller than the internal diameter of discharge cavity 26. By making nozzle 6 narrower, not only is less sputtered material from liner 16 able to reach the process chamber, but the process gas 27 must pass through plasma region 39 to exit discharge cavity 26.

Figure 2:
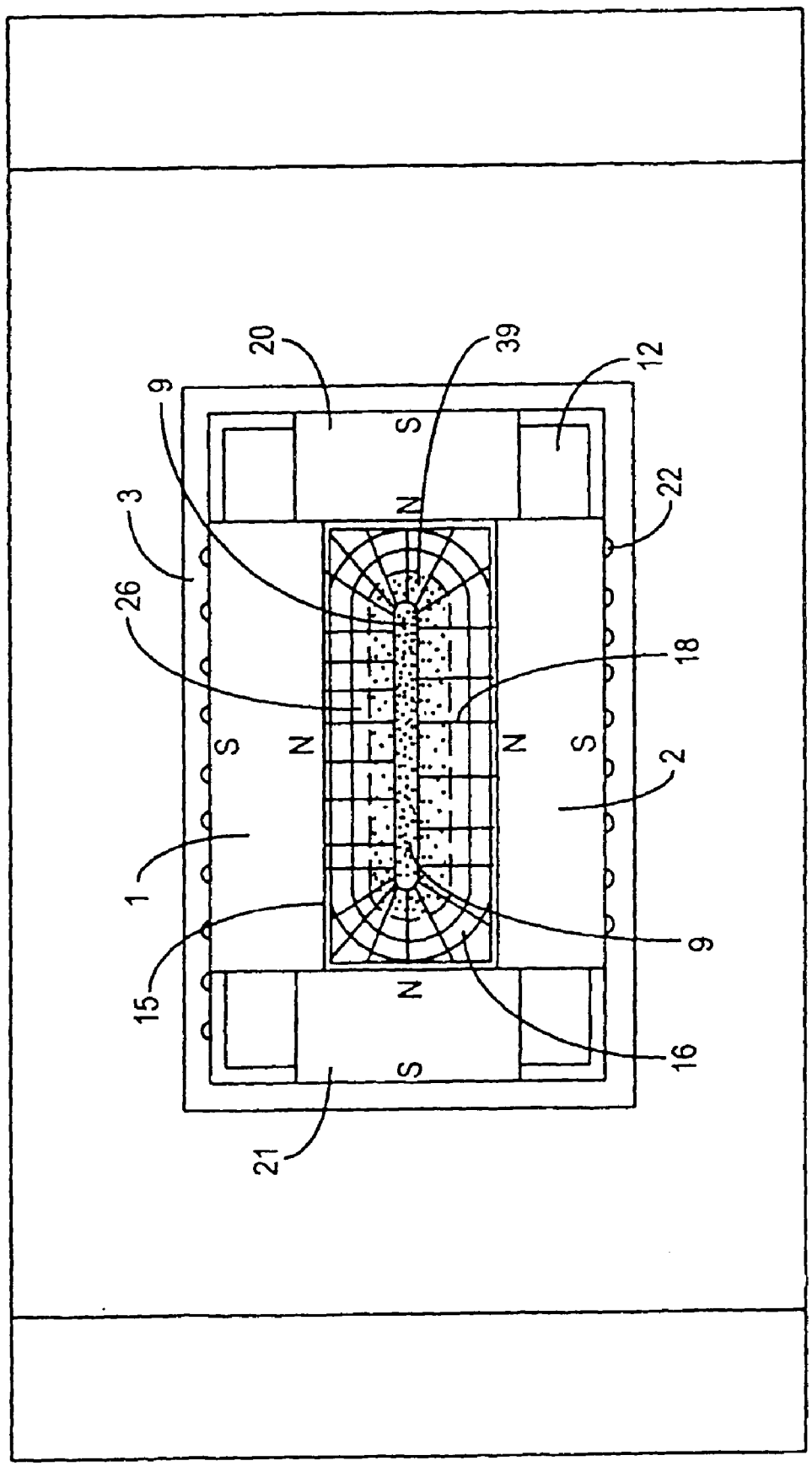
FIG. 2 shows a top section view of the apparatus of FIG. 1.

FIG. 2 shows a top view beam source 24 with cover 5 removed. End magnets 20 and 21, in combination with side magnets 1 and 2, create the closed drift magnetic fields 18 and 19, with only magnetic field 18 shown in FIG. 2. FIG. 2 also includes box 3, liner 16, insulator 15 and, below magnets 1, 2, 20 and 21, water cooled block 12. Plurality of grooves 22 in box 3 for gas 27 are also illustrated. Plasma 9 is shown as the darker portion in the center. The lighter portion corresponds to plasma region 39.

Figure 3:
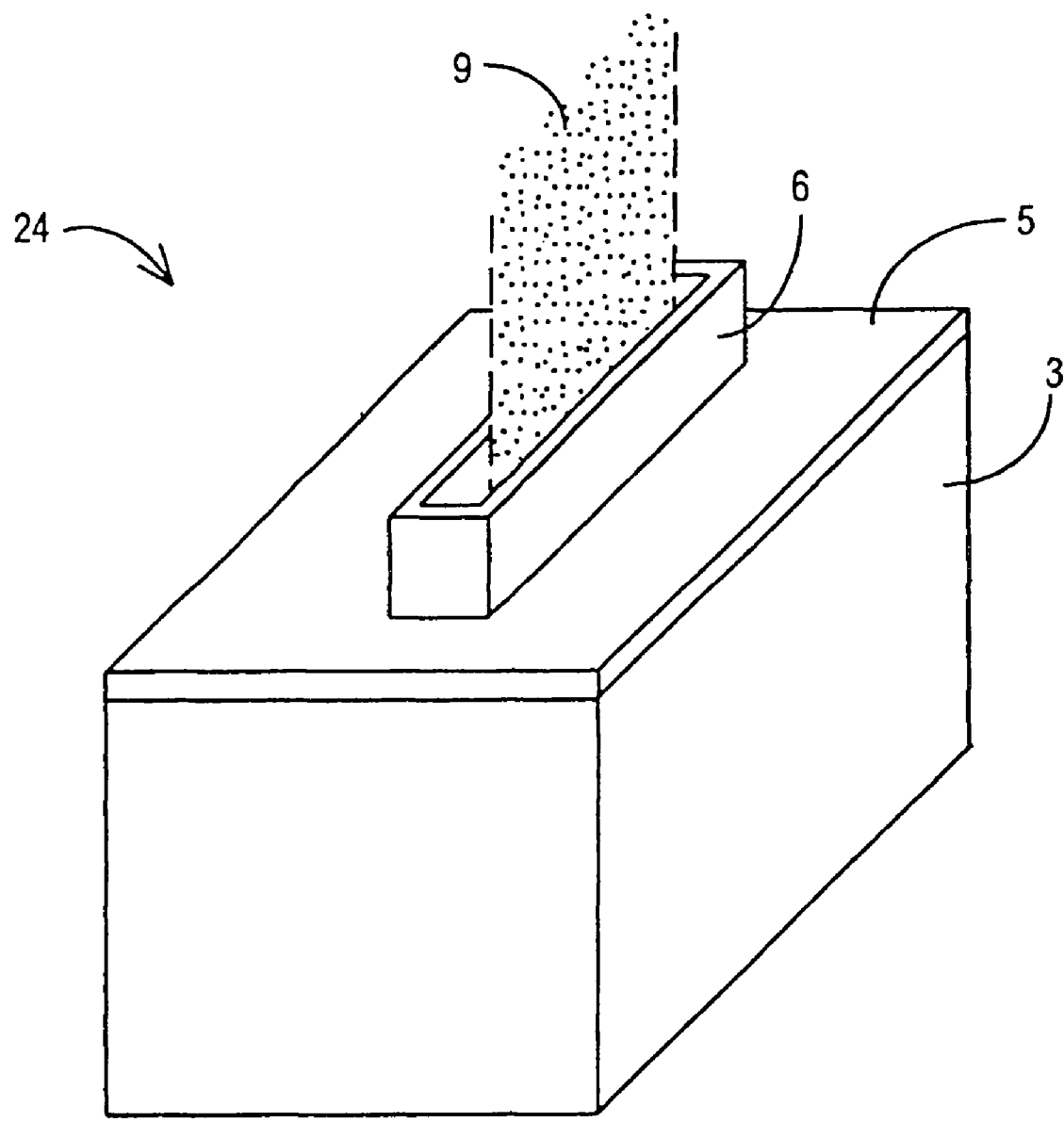
FIG. 3 shows an isometric view of the apparatus of FIG. 1.

FIG. 3 shows an isometric view of beam source 24 where certain water cooling piping is not shown. As described above, this water piping is useful to make electrical connections to both electrodes. In the illustrated embodiment of FIG. 3, plasma 9 emanates outwardly from nozzle 6 into the process chamber. As shown, plasma 9 forms a narrow uniform beam extending outwardly from nozzle 6.

As those skilled in the art will appreciate, beam source 24 may comprise many shapes, sizes, scales, and may include a plurality of materials. For example, in one embodiment source 24 was constructed as follows: Magnets 1 and 2 were ceramic type measuring about 1" wide×about 4" long×about 1" thick. Magnets 20 and 21 were about 1" wide×about 2" long×about 1" thick. Block 12 was formed from brass. Top cover 5 and nozzle 6 were formed of copper. The opening in nozzle 6 was about 0.75" wide×about 0.75" deep×about 3.5" long. Shunt 10 and shunt 11 were formed of mild steel. Liner 16 was formed of copper sheet bent into an oval shape, with the oval measuring about 1.5" wide. As can be seen from FIG. 1A, the nozzle 6 opening width of 0.75" corresponds to aperture 101 width 115. The liner 16 width of 1.5" corresponds to discharge cavity 26 width 110. As those skilled in the art will appreciate, many variations and modifications can be made regarding the dimensions and materials of source 24 without departing from the scope of Applicant's invention.

Beam source 24, and the plasma 9 generated therewith, have many useful properties, including the following measured values using the source described immediately above:

Plasma 9 is very dense, with ion densities exceeding $10^{12}$ per $cm^3$ when using a DC power supply output of 1 kW at 300 V. The ion saturation current was measured at over 100 mA for the source dimensions given and these power supply settings. The current probe surface was positioned 5 cm beyond the end of nozzle 6 blocking plasma 9. Electron current with the probe grounded is greater than 1 A.

Plasma 9 is uniform over the length of the source, minus end effects at the turnarounds. This is important for applications where uniformity of deposition, treatment, or etching is required, as it is in most applications. Substrate widths of 3 meters or greater can be uniformly processed. In operation, plasma 9 appears as one cm wide uniform beam extending outwardly from nozzle 6.

Plasma beam source ("PBS") 24 is not a sputter source. Rather, source 24 is useful for PECVD, plasma treatment, or etching processes. Although sputtering of the liner material does occur, only minimal amounts of sputtered material exit nozzle 6 for several reasons. First, the magnetron plasma region 8 (FIG. 1) is located deep inside the source. Sputtered liner material redeposits on the liner, the shunts 10 and 11 and/or on the cover 5 and nozzle 6. Because the sputtered material readily condenses upon contact with a surface, source 24 includes a 'torturous path' for sputtered material to exit the source. Second, by feeding process gas into the discharge chamber above magnetron plasma 8, the flow of supply gas to the plasma 8 is directed away from nozzle 6, creating directional momentum effects opposing condensate flow out of nozzle 6.

A low sputter rate of the source is actually observed in operation. For example, when depositing a PECVD Silicon Oxide coating, after several microns of coating were deposited, the resulting coating appeared optically clear. This clear coating was produced using a copper liner 16. As those skilled in the art will appreciate, sputtered copper in a mixture of oxygen and argon gases comprises a black coating. No such black coating was observed forming a silicon oxide coating on a substrate using source 24.

Pure reactive gas can be 'burned' in source 24. Prior aft high density plasma sources implement filaments, low work function materials, or field effect devices, to generate electrons. These sources typically feed an inert gas, such as argon, into the source. Use of a reactive gas such as oxygen inside the source tends to greatly shorten electron source lifetimes. To accomplish a reactive process, these sources feed oxygen into the plasma outside the source, reacting a portion of the oxygen with the argon plasma emanating from the source. While the efficiency of such prior art sources is low, those sources are nevertheless used today for many processes because no alternative exists.

In marked contrast, however, Applicant's beam source 24 can produce a high density, pure oxygen plasma. This has advantages to several processes. In addition, the vacuum pumping requirements are also reduced because argon flow requirements are not a factor when using source 24.

Applicant's beam source 24 can be operated over a wide range of process pressures. As is typical for magnetron type sources, the PBS can readily operate at pressures in the 1-100 mTorr region. In addition to this pressure range, operation can be extended down to the $10^{-5}$ Torr range used in evaporation processes. Such pressures may be used because nozzle 6 limits gas conductance out of the source. By feeding the process gas 27 into discharge cavity 26, the pressure inside discharge cavity 26 can be sustained in the mTorr region, while outside the source the process chamber may be maintained at a much lower pressure. Also, process gas flow requirements are minimized because discharge cavity 26 can be maintained in the required mTorr region with less gas 27 flow due to the conductance limitation presented by the narrow nozzle 6 opening.

Plasma beam 9 extends outwardly for 100's of mm from nozzle 6 depending upon the free mean path inside the process chamber. At 3 mTorr for instance, the beam extends at least 300 mm outwardly from nozzle 6. Formation of such a plasma beam allows beam source 24 to excel at many applications. For instance, non-planar substrates can be uniformly PECVD coated, treated, etc.

Substrate 23 can be electrically isolated from beam source 24. Because the substrate is not part of the electrical circuit, the substrate can remain floating or be separately biased by a different power supply. In certain embodiments, beam source 24 comprises a standard magnetron power supply using variety of frequencies, including DC or AC from 0-100 MHz frequencies. Special high voltage power supplies or RF supplies do not have to be used. The connection to chamber ground can also be made to either side of the power supply. In FIGS. 1-3, box 3 and cover 5 are connected to ground. This is convenient for safety considerations.

Figure 4:
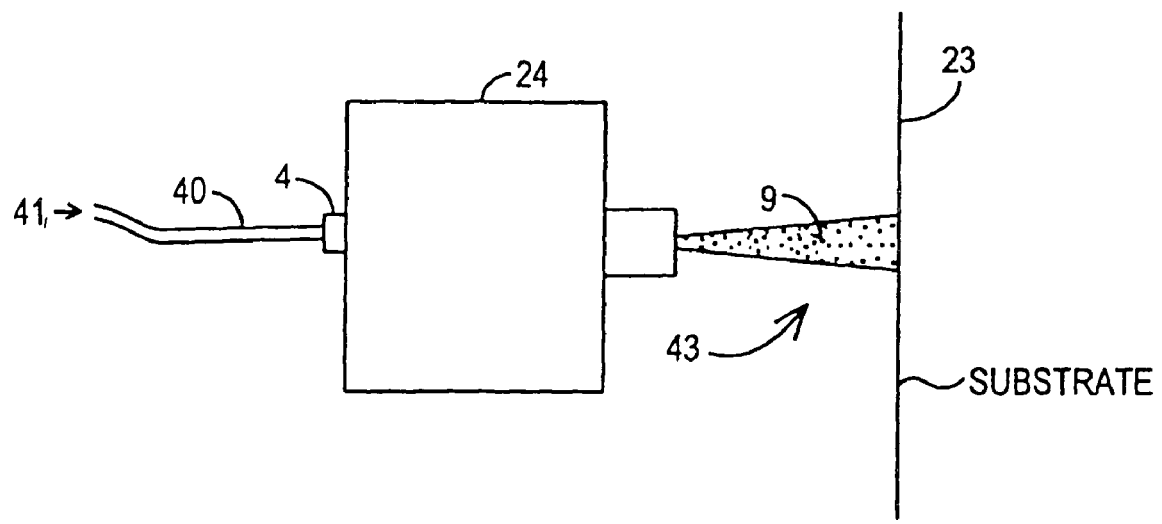
FIG. 4 shows a view of Applicant's beam source comprising separate gas inlets, with the beam directed toward a substrate.

FIG. 4 shows beam source 24 in a PECVD coating application. A mixture of argon and oxygen 41 are delivered to source port 4 via tube 40. A monomer gas 43 is released outside the source. A polymeric coating is deposited onto substrate 23 by polymerization of monomer gas activated by the ionized gas in plasma 9. Because of the conductance limitation of nozzle 6, and because of the high density and directionality of the plasma 9 exiting through nozzle 6, the monomer gas 43 does not enter source 24. This is actually observed when, after a coating run, the discharge cavity 26 of beam source 24 is essentially free of PECVD coating.

The substrate 23 can comprise a multitude of materials and shapes. Such substrates include, for example and without limitation, flexible webs, flat glass, three dimensional shapes, metals, silicon wafers, and the like. Other physical and process configurations are possible using beam source 24. For example, one or more monomer gases can be introduced into the discharge cavity 26 without immediate buildup problems. In addition, certain monomer gases, such as hydrocarbons, can be fed into the source for extended periods. Beam source 24 may also perform other plasma processes such as plasma treatment, surface cleaning, or reactive ion etching.

Figure 5:
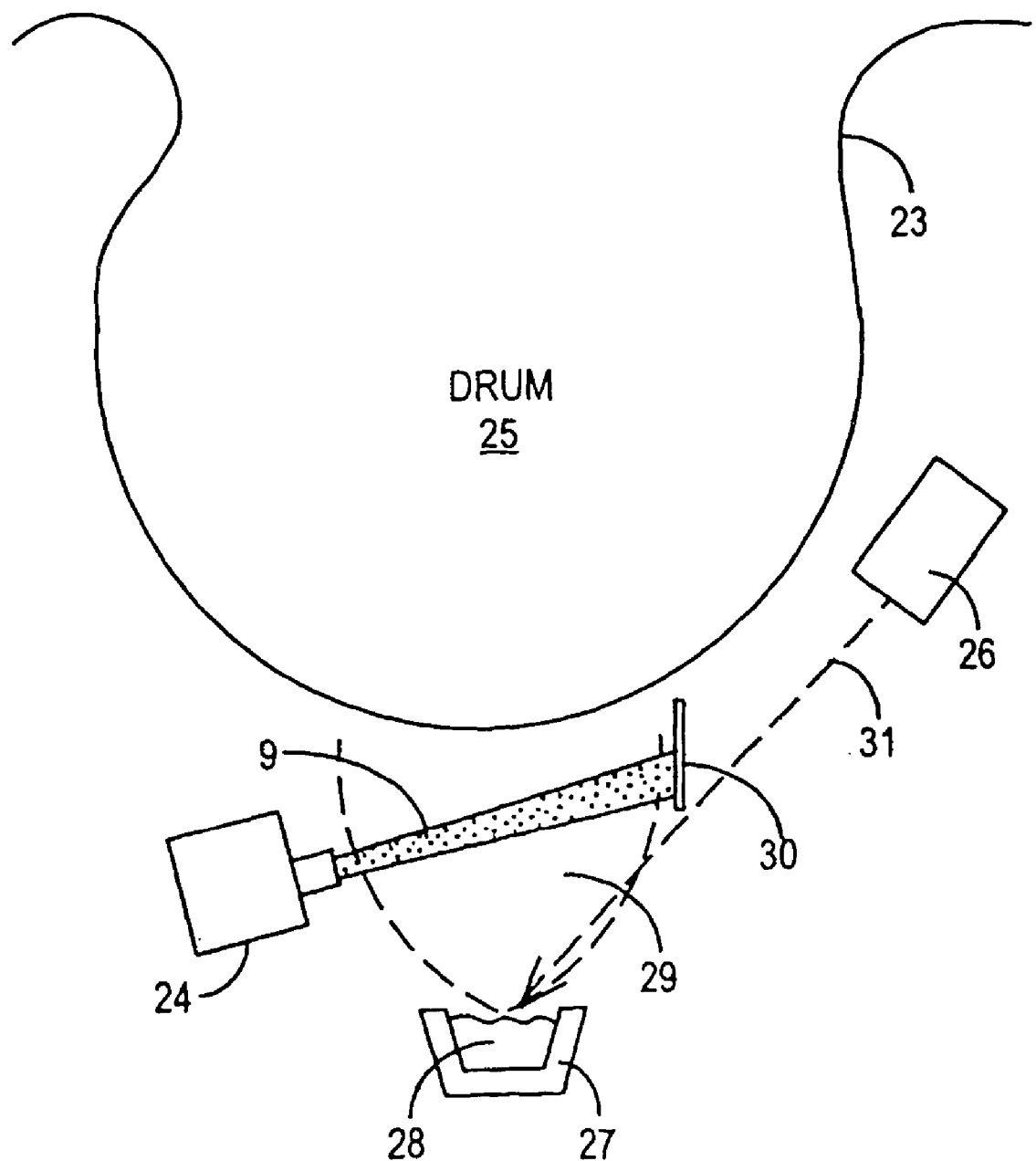
FIG. 5 shows a view of Applicant's beam source used to assist reactive deposition in an electron beam evaporation application.

FIG. 5 shows beam source 24 used to react evaporant 29 in an electron beam evaporation web coating application. Drum 25 carries web 23 over the deposition region. Crucible 27 contains evaporant material 28. Electron beam source 26 projects beam 31 into crucible 27. Plasma 9 is directed into the evaporant cloud 29 to promote reaction with the ionized gas of the plasma 9. Shield 30 limits the interaction of plasma 9 with the electron beam 31.

Using prior art methods, complicated hollow cathode sources have been used to accomplish evaporant reactance. Hollow cathodes are inherently non-uniform as the plasma outside of the hollow cathode is only diffusion limited. With Applicant's beam source 24, the magnetic field lines 19 contain the electrons, and by electrostatic forces, the ions are likewise contained in plasma region 9. Also as described above, beam source plasma 9 is uniform over the substrate width due to the closed drift nature of the electron containment.

Figure 6:
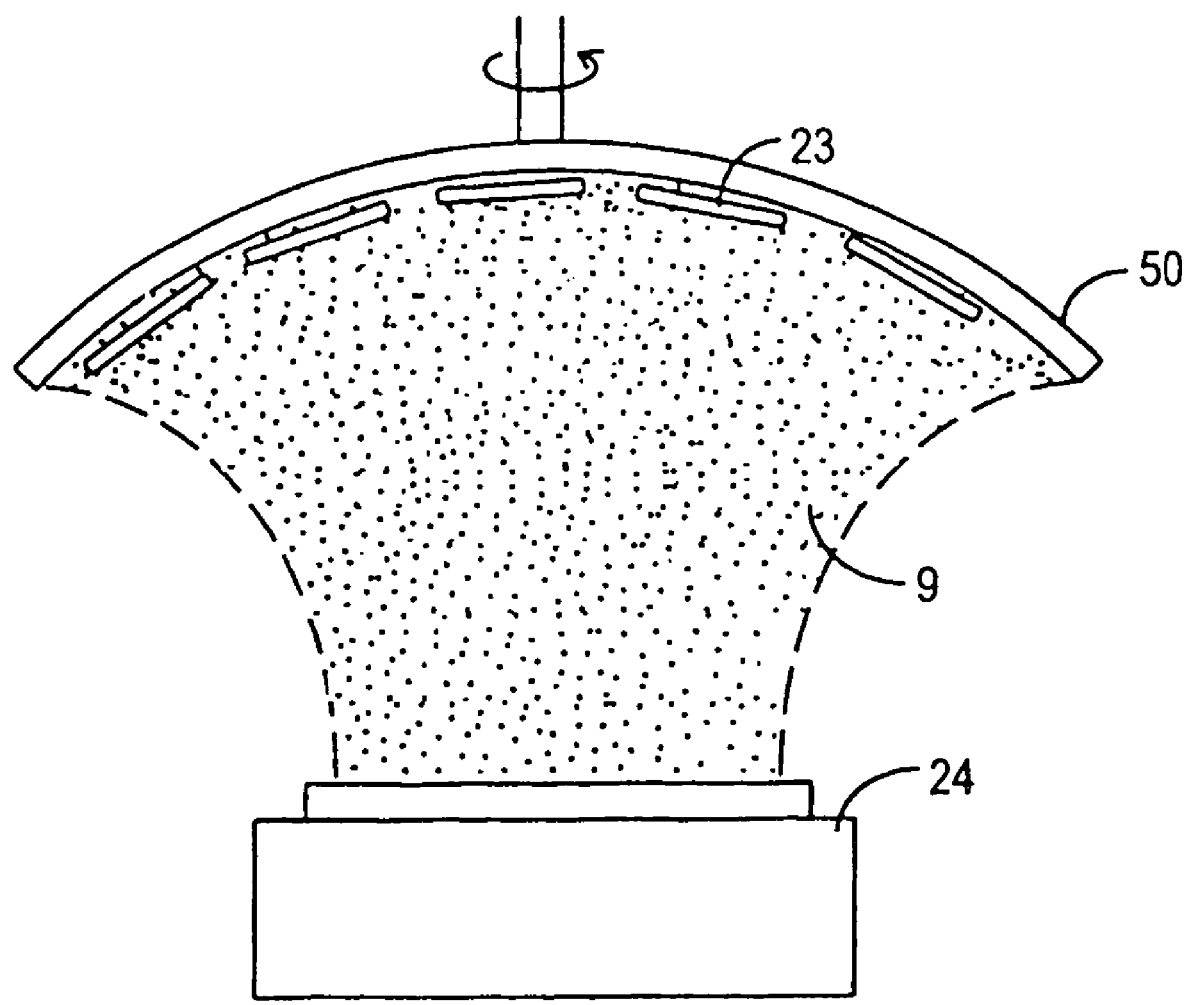
FIG. 6 shows a side view of Applicant's beam source applied to a planetary/box coating application.

FIG. 6 depicts the beam source 24 applied to a planetary box coater application. In this view the source 24 is shown along its length rather than from an end view. In the illustrated embodiment of FIG. 6, plasma beam 9 appears as a sheet of plasma. Source 24 is positioned sufficiently remotely from the substrate supporting planetary, at the bottom of the box coater for example, to allow room for other deposition sources, such as electron beam, or thermal evaporation sources, for instance. By combining the beam source 24 with other deposition sources, coatings can be densified by the action of plasma 9. In certain embodiments, pure argon is used to densify a metal coating. In other embodiments, a reactive gas is added to the argon.

A major advantage of Applicant's source over the prior art is the ability to directly consume reactive gases, such as oxygen, in the source. Prior art sources, due to the need for filaments or other electron generation means sensitive to consumption by a reactive gas, required the use of an inert gas in the source. In these prior art sources, the reactive gas was fed into the process chamber external to the source. The necessarily poor efficiency of ionizing the reactive gas in the chamber rather than in the source itself requires high source powers and high argon flow rates. In contrast, using beam source 24 to produce a pure reactive plasma, or a combination of inert and reactive as required, process efficiency is increased and the overall pumping speed needed to maintain the process at the correct pressure is reduced. As those skilled in the art will appreciate, excess argon need not be pumped away.

Figure 7:
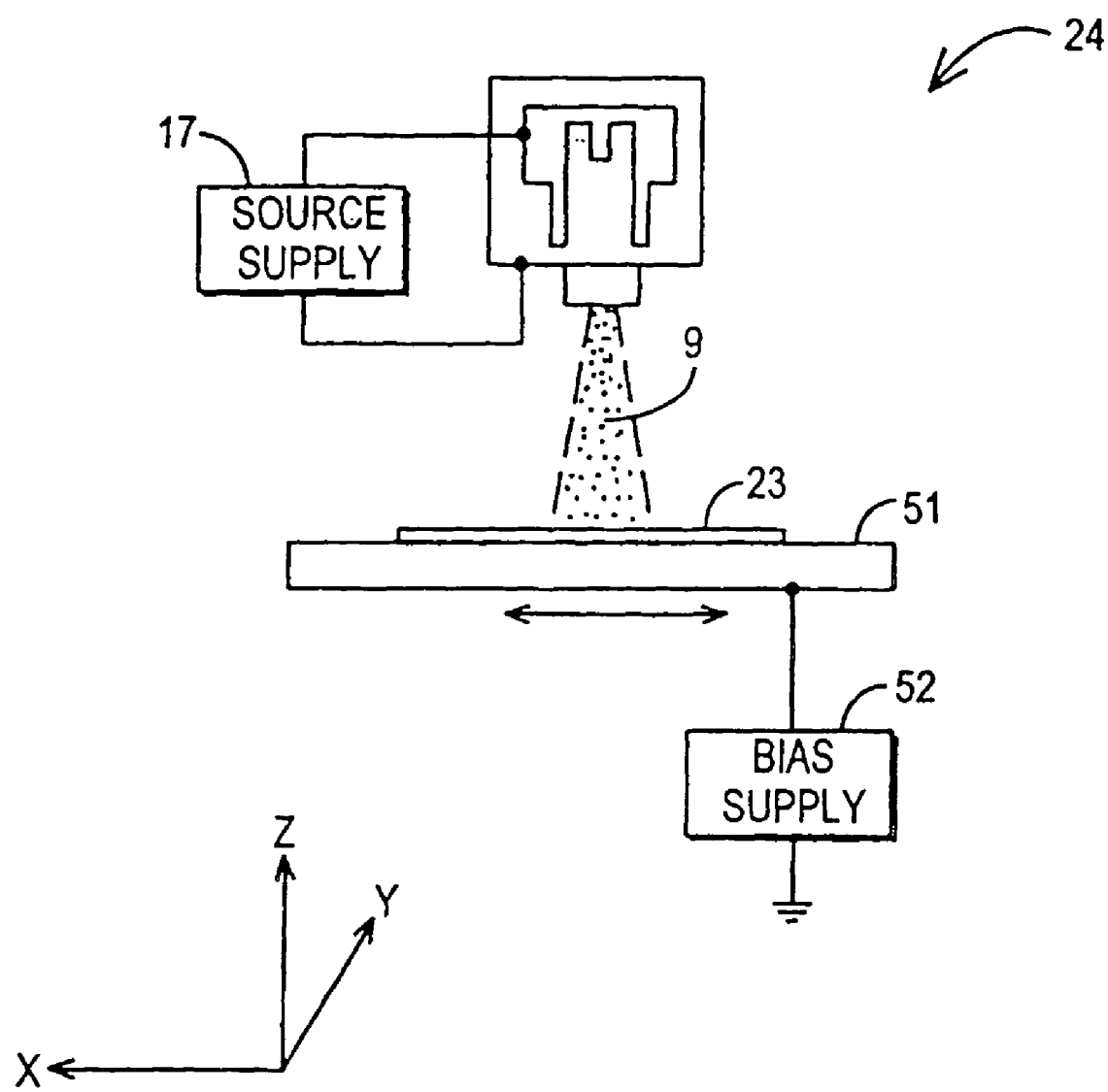
FIG. 7 shows Applicant's beam source with the plasma directed onto a translating, biased substrate.

FIG. 7 shows beam source 24 disposed above a substrate 23, such as a silicon wafer. In the illustrated embodiment of FIG. 7, the stage 51 supporting the wafer 23 is translated, i.e. moved, in the X and/or Y directions to uniformly treat wafer 23 with plasma 9. The embodiment in FIG. 7 illustrates the ability to separately bias substrate 23 and source 24. Bias supply 52, in this case an AC supply of sufficient frequency to pass current through the wafer 23, is connected to stage 51. Beam source supply 17 produces plasma 9. Without the bias supply 52, the insulating substrate 23 would normally rise to the characteristic floating voltage of plasma 9, i.e. typically between about −10 to about −70 volts for the beam source 24 depending upon process conditions. By turning on bias supply 52, the voltage drop across the plasma dark space between the plasma 9 and substrate 23 can be changed, positively or negatively, to a level required for the process. Because the substrate 23 is not an electrode in beam source 24, it can be separately biased.

Figure 8:
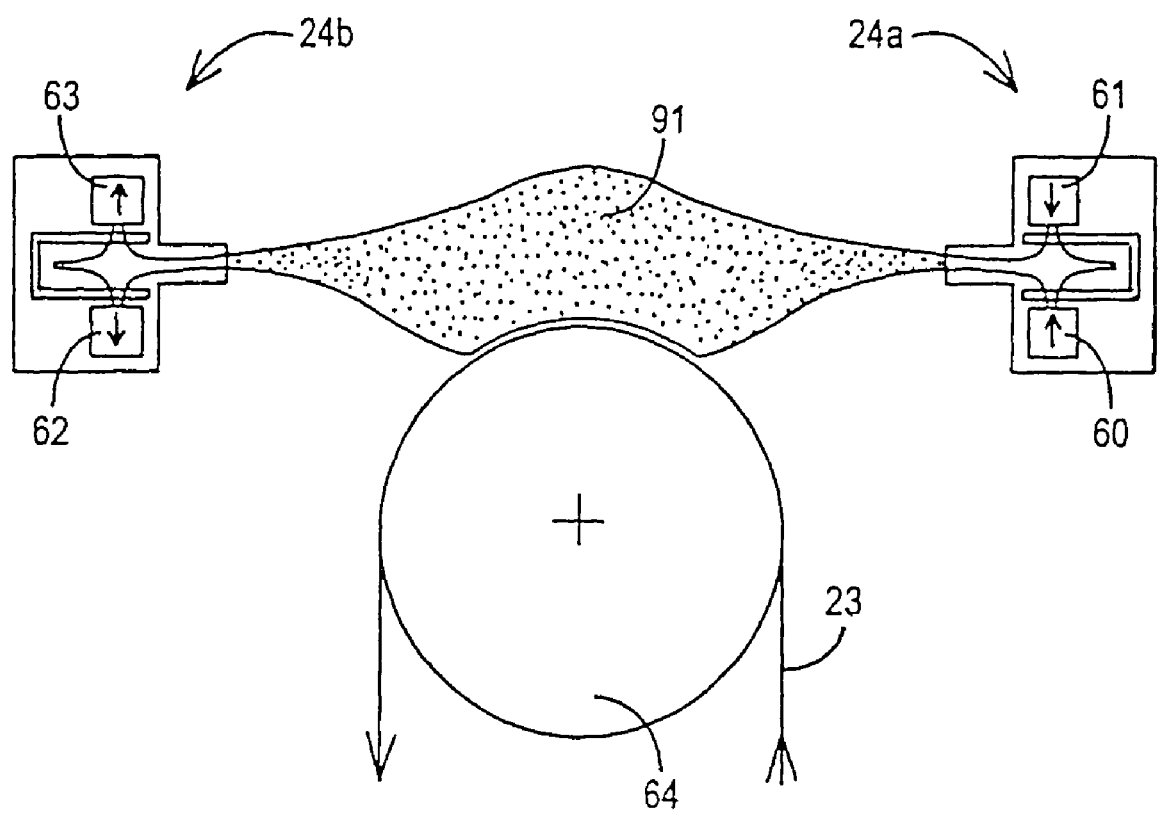
FIG. 8 shows two beam sources facing each other with opposite pole magnets.

FIG. 8 shows two beam sources, 24a and 24b, used to generate a large area uniform plasma 91 over a substrate. In the illustrated embodiment of FIG. 8, the substrate comprises flexible web 23 drawn over roll 64. The two beam sources 24a and 24b are identical, except magnets 60 and 61 of source 24a, and the end magnets (not shown) in source 24a are disposed such that the south pole has a facing relationship with plasma 91, while source 24b has magnet 62 and 63 north poles facing inwardly. This configuration creates a sharing of magnetic fields between the sources and produces the closed plasma region 91 as shown.

Figure 9:
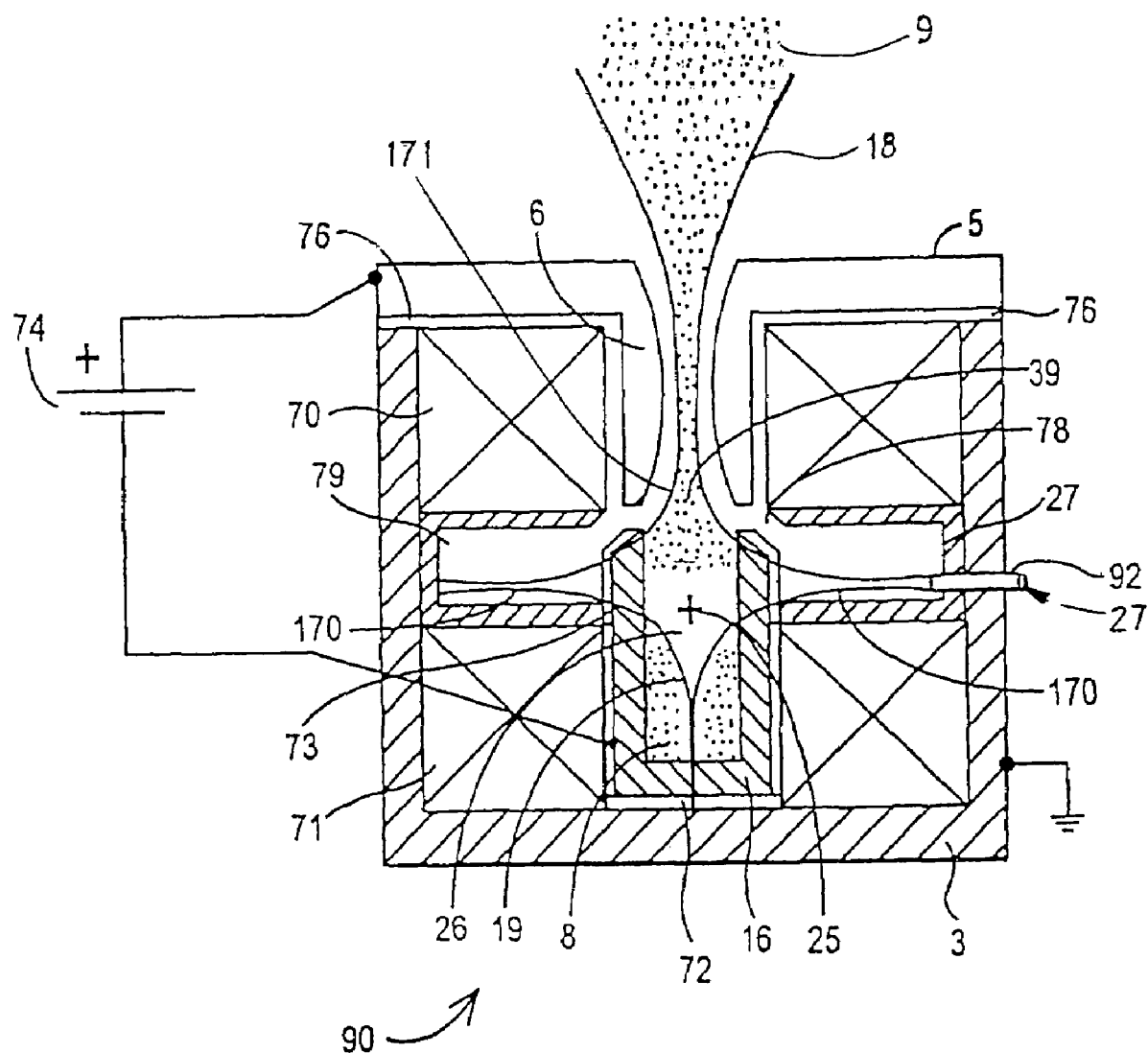
FIG. 9 shows a section view of an electromagnet version of Applicant's invention for a space thruster application.

FIG. 9 shows a section view of source 90 configured for a space propulsion application. The basic components of the magnetron electron source and cusp magnetic field are the same as in earlier figures. In source 90, the magnetic cusp fields 18 and 19 are created by annular electromagnets 70 and 71. The electron source magnetron plasma 8 is created within the liner tube 16. Liner 16 is electrically isolated from box 3 by insulator plate 72 and from electromagnet 71 by insulator ring 73. The propellant gas 27 is introduced into gas cavity 79 through port 92. Gas 27 then flows into discharge cavity 26 via gap 78 between liner 16 and opposed electrode 5.

Cover electrode 5 is electrically isolated from round box 3 by insulator plate 76. Cover 5 has a nozzle portion 6 that fits down into the annular opening in electromagnet 70. Liner 16 and cover 5 are connected across power supply 74. The illustrated embodiment of FIG. 11 includes a DC supply with the cathode terminal connected to liner 16. In other embodiments, an AC or RF power supply is used. Box 3 is connect to ground. When power supply 74 is turned on, and gas 27 is flowing into discharge cavity 26, electrons created by magnetron plasma 8 are trapped in mirror field region of magnetic field 18, and plasmas 9 and 39 are created. Thrust is generated as the plasma 9 is expelled through nozzle 6. One component of the thrust is generated by the magnetic nozzle effect. After passing through magnetic mirror 39, electrons then experience a decrease in magnetic field strength as they move outwardly from nozzle 6. In response to this negative gradient field, electron motion is converted from thermal spinning to kinetic motion along the axis of the field lines. The electrons in turn electronically pull ions into accelerating away from the source.

Another form of ion thrust is produced if the magnetic field in region 18 is increased to confine ions, i.e. to a magnetic field strength exceeding at least 1000 Gauss. Under this condition, ions are magnetically confined and heated by the radial electric field as they pass through nozzle 6. As those ions exit the nozzle, they are accelerated by both the electrostatic repulsion from anode 5 and by the magnetic nozzle effect.

The electron confinement achieved using Applicant's source includes physically limiting two of the possible three axial magnetic field electron escape paths by liner 16. The three axial magnetic field regions include: (i) cone shaped compressed region 171, (ii) cone-shaped compressed region 19, and (iii) planar disk compressed region 170. When liner 16 is connected as the cathode of a DC circuit, or is on a negative AC cycle of an AC power supply, electrons are electrostatically reflected from the liner's surfaces. As electrons attempt to reach the anode electrode 5, they travel by collisional diffusion across field lines 19 and through mirror region 39 to exit the source through nozzle 6 before returning to cover 5. While diffusing across magnetic field lines, the electrons also spiral along these field lines. By configuring the source so magnetic field lines 170 pass through liner 16, electrons moving along these field lines remain electrostatically contained. If field lines 170 were allowed to pass through an electrically floating surface or opposed electrode 5, some number of electrons would escape through the compressed mirror of field lines 170. Allowing only one axial magnetic field region 171 to be open to electron escape increases the efficient use of electrons in creating and sustaining plasma plume 9.

Figure 10:
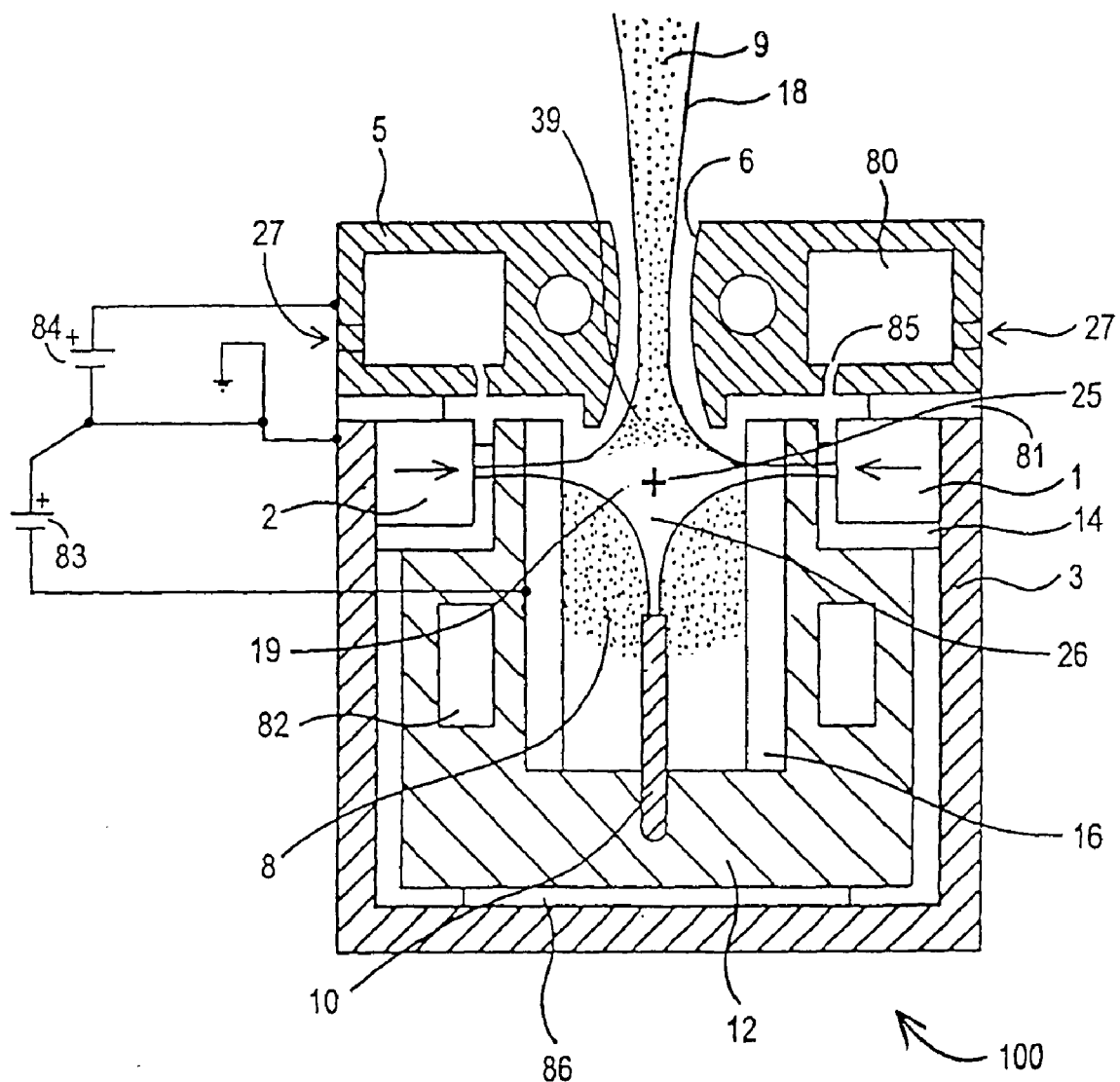
FIG. 10 shows an embodiment comprising an electrical power arrangement enhancing the ion source aspects of the present invention.

FIG. 10 shows beam source 100. In various embodiments, source 100 is circular, annular, or extended length wise. In the illustrated embodiment of FIG. 10, source 100 includes rare earth magnets 1 and 2, and two power supplies 83 and 84. Power supply 83 is connected between cathode liner 16 and box 3. Insulator 81 separates box 3 electrically from cover 5. Power supply 84 is connected between anode cover 5 and box 3. Box 3 is grounded.

Using the illustrated configuration of FIG. 10, the plasma 9 potential can be adjusted relative to ground. This is useful when applying the plasma 9 to a grounded substrate. By increasing the plasma 9 potential, the ion energy striking the substrate is increased. FIG. 10 further illustrates process gas manifolds 80 built into cover 5. Small distribution holes 85 conduct the gas 27 uniformly along the length of source 100 into discharge cavity 26. Facing the magnets 1 and 2 toward each other in a cusp arrangement, creates a strong mirror compression ratio in mirror region 39. With rare earth magnets 1 and 2, the field strength at the mirror apex can exceed 500 Gauss. As electrons pass through this mirror region 39, they experience this strong field and their Larmor gyro radius is correspondingly small. Under these conditions, when the plasma is viewed from the end as in this section view, the plasma 9 width passing through nozzle 6 is very narrow, on the order of 3 mm.

This strong cusp field is an advantage over vertically directed magnets of Window and Savvides, Heliner, and others. With vertically oriented magnets, while a null region 25 is created above the magnetron confined region 8, the field strength is typically less than 100 Gauss and the electron Larmor gyro radius is larger. In the illustrated embodiment of FIG. 10, shunt 10 is fitted into aluminum body 12. Shunt 10 reduces the sputter rate of liner 16, and evens out liner 16 sputtering to make the liner 16 last longer. While helpful in this regard, shunt 10 is not necessary to the fundamental source operation.

In source 100 body 12 is water cooled by extruded holes 82. Insulators 14 and 86 support cathode body 12 in box 3 and electrically isolate the cathode, i.e. body 12 and liner 16, from box 3. Source 100 may be rectangular having an extended length. End magnets, used to make both magnetic field regions 8 and 9 closed paths, are not shown in FIG. 10.

Figure 11:
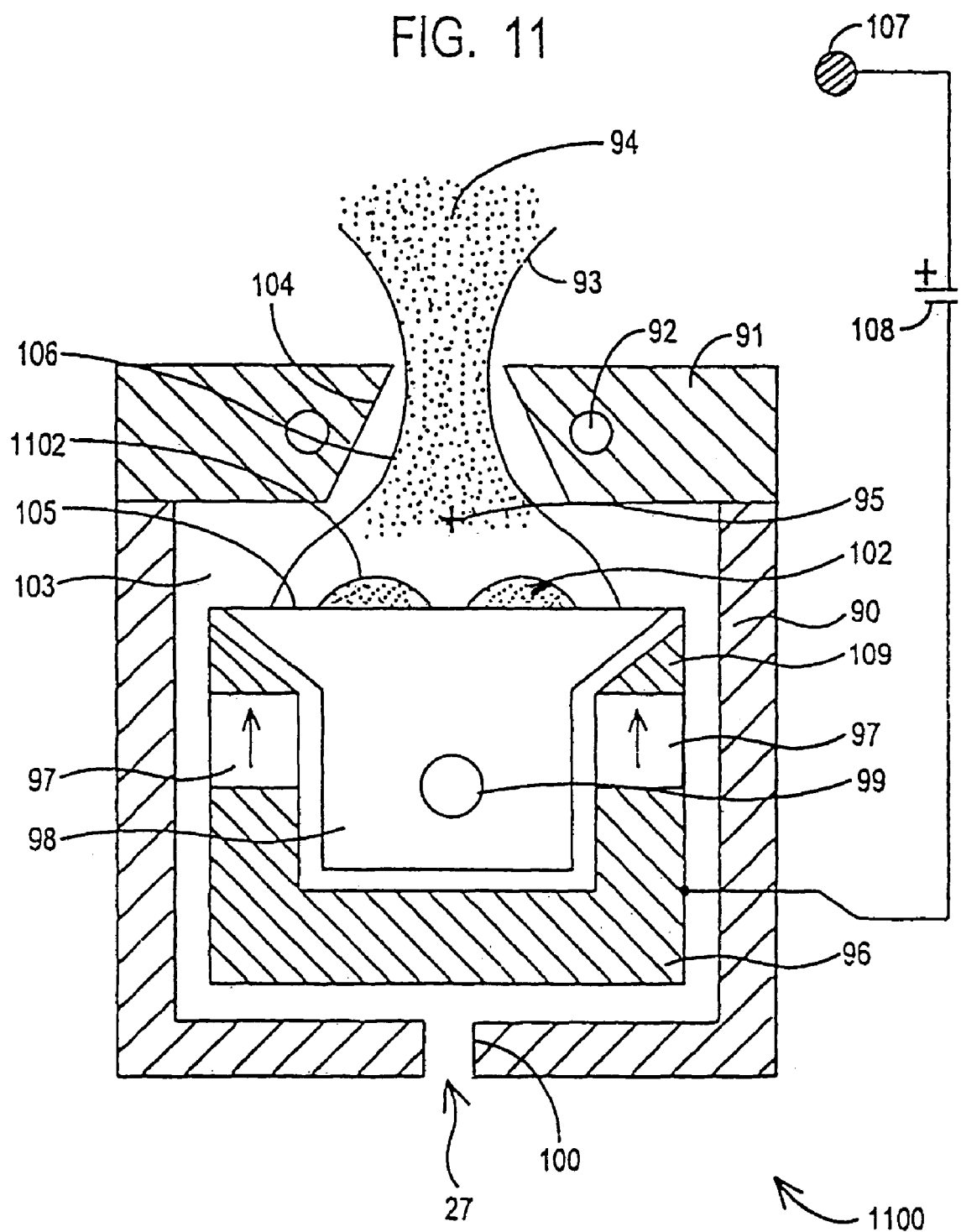
FIG. 11 shows a section view of Applicant's beam source implementing vertically oriented magnets and a planar cathode.
Figure 12:
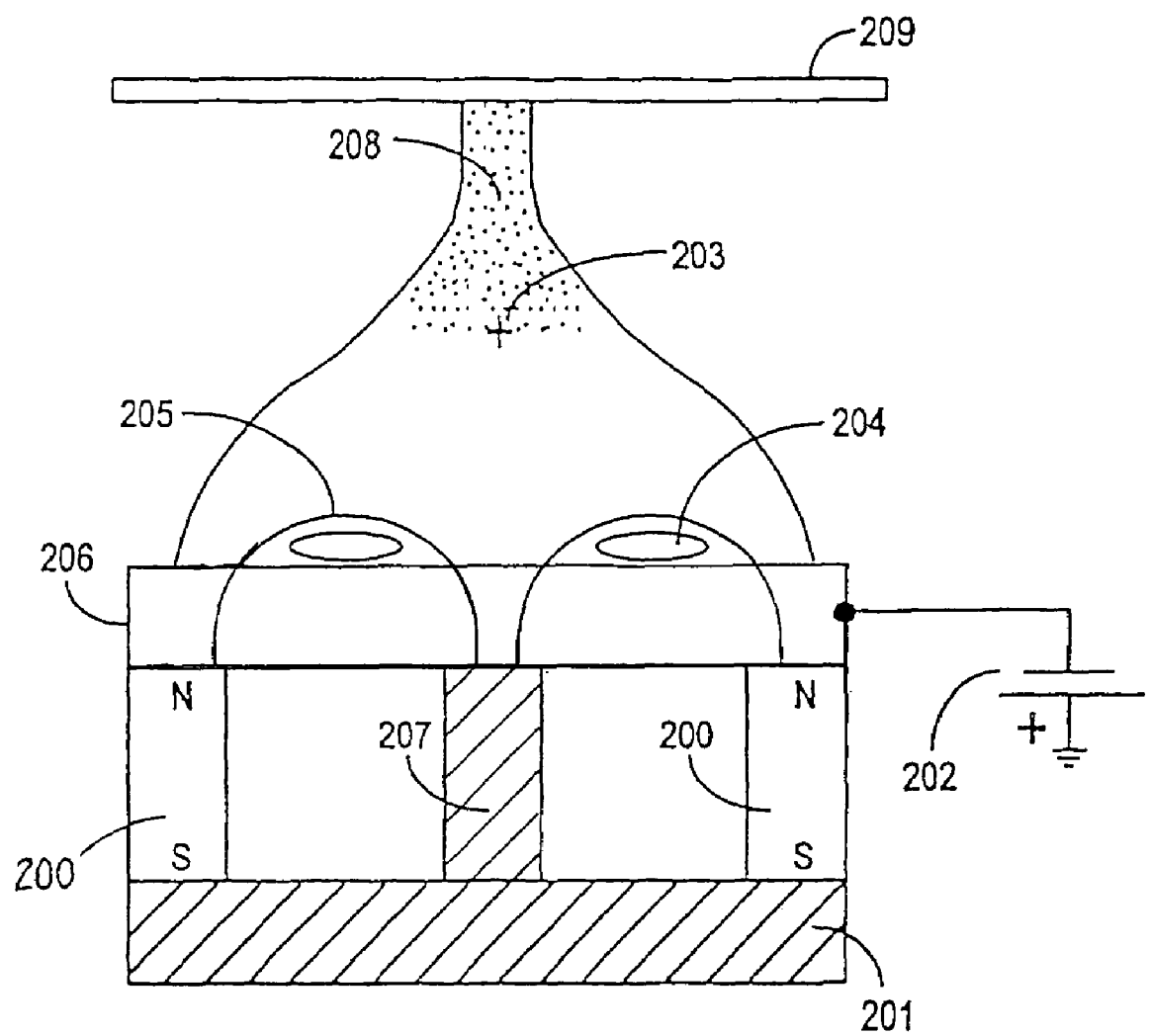
FIG. 12 shows a section view of a prior art unbalanced magnetron sputter source.

FIG. 11 shows beam source 1100 having vertically oriented magnets. This magnet configuration is representative of a Type II unbalanced magnetron magnetic field as taught by Window and Harding. A range of magnet 97 shapes, and discharge cavity 103 shapes, can be implemented within the scope of Applicant's invention. In the illustrated embodiment of FIG. 11, magnets 97 create two confinement regions: magnetron confinement 101 at cathode 98 surface 105, and mirror/nozzle confinement 93 through nozzle 104.

As in other embodiments of Applicant's source, a magnetron electron generation region 1102 is contained in a discharge cavity 103. The discharge cavity contains a null magnetic field region 95. A aperture 104 in cover plate 91 has a centerline coincident with the axis of mirror field 93.

Planar liner 98 is water cooled via gun drilled hole 99 and is fitted into shunt 96. Magnets 97 and angled shunts 109, along with shunt 96 produce the unbalanced magnetic field depicted. Planar cathode 98 and magnet components 96, 97 and 109 are suspended by electrical insulators (not shown) in electrically floating box 90. Electrically floating cover plate 91 is fastened to box 90. Cover plate 91 is water cooled via holes 92. Piping to direct water to the cover plate 91 and cathode 98 is not shown. Gas 27 is piped into box 90 through threaded hole 100. Gas 27 flows around magnet shunt 96 and into discharge cavity 103.

When power supply 108 is turned on, a magnetron plasma 102 lights and supplies electrons to mirror confinement region 106. Electrons caught in mirror confinement region 106 collide with gas 27 also attempting to exit through the nozzle 104 opening, and dense plasma 94 is created. The illustrated embodiment of FIG. 11 includes a separate anode 107. Cover 91 is not connected as an electrode in the electrical circuit. Cover 91 comprises a conductance limitation to the exiting gas 27, forcing the gas to exit through the mirror confinement region 106 in nozzle 104. Given the high mobility of electrons, positioning the return electrode 107 external to the source produces little noticeable change in source performance after the source lights. Because the anode 107 is more distant from the cathode 98, a pressure spike may be needed in cavity 103, depending upon the base pressure and the ignition voltage of the power supply 108 used, to ignite the plasma 102.

Once a conductive plasma 102 has ignited, the anode electrode can be located in any location within the process chamber. When the anode electrode is nozzle 104, some ion acceleration benefits can be obtained as described earlier. In illustrated embodiment of FIG. 11, the liner material comprises aluminum. Aluminum is a good secondary electron emitter when oxygen gas 27 is used. Moreover, the reactive product, alumina, formed on the cathode surface 105 sputters very slowly. These are advantages to beam source operation because a high electron current for a given power is generated and the cathode material 98 is slow to be sputtered away.

Other materials having these properties may also be used. For example, when an argon plasma 94 is desired, carbon is a good cathode material. While not an exceptional secondary electron emitter, carbon sputters very slowly in argon. Note that FIG. 11 is a section view. Source 1100 can be round, or rectangular, and can be extended to lengths longer than 1 meter. The present invention enables many applications and processes, several have been mentioned above. More will be apparent to those skilled in the art. While several embodiments have been presented, many others are possible within the scope of the present invention.

I claim:

1. A plasma beam source, comprising in combination:
   a discharge cavity having a first width;
   a nozzle extending outwardly from said discharge cavity, said nozzle having a second width which is less than the first width;
   at least one electrode for supporting at least one magnetron discharge within said discharge cavity;
   a plurality of magnets disposed adjacent said cavity for creating a magnetic field null region within said discharge cavity; and
   an inlet, other than said nozzle, for introducing an ionizable gas into said discharge cavity.

2. The plasma beam source of claim 1, wherein the ionizable gas inlet is located between said cathode electrode and said nozzle within said discharge cavity.

3. The plasma beam source of claim 1, wherein the magnetic field includes three axial field regions, wherein two of the three axial field regions adjacent to the null region pass through said cathode electrode, and wherein the third axial field region comprises a mirror confinement region emanating through said nozzle.

4. The plasma beam source of claim 1, wherein the magnetic field null region is located along a center-line of said nozzle.

5. The plasma beam source of claim 1, wherein said electrode is formed of a material which has a secondary electron emission coefficient greater than about 1.

6. The plasma beam source of claim 1, further comprising a first power supply connected to said magnetron supporting electrode.

7. The plasma beam source of claim 6, wherein said nozzle is electrically interconnected with said first power supply to render said nozzle an electrode electrically opposed to said magnetron supporting electrode.

8. The plasma beam source of claim 1, wherein said nozzle is electrically floating.

9. The plasma beam source of claim 1, wherein said nozzle is electrically connected to the ground.

10. The plasma beam source of claim 7, further comprising a second power supply connected to said nozzle.

11. A plasma processing apparatus, comprising:
    a plasma beam source comprising a discharge cavity having a first width;
    a nozzle extending outwardly from said discharge cavity wherein said nozzle has a second width which is less than the first width;
    at least one electrode for supporting at least one magnetron discharge within said discharge cavity;
    a plurality of magnets disposed adjacent to and external of said discharge cavity for creating a magnetic field null region within said discharge cavity;
    an inlet, other than said nozzle, communicating with said discharge cavity for introducing an ionizable gas into said discharge cavity; and
    a process chamber, said beam plasma source being disposed within said process chamber.

12. The plasma processing apparatus of claim 11, further comprising an anode disposed within said process chamber disposed physically apart from said plasma beam source.

13. The plasma processing apparatus of claim 11, wherein said beam plasma source includes a cusp magnetic field producing at least one magnetron confinement zone within said discharge cavity.

14. The plasma processing apparatus of claim 11, further comprising a power supply connected to said electrode.

15. The plasma processing apparatus of claim 11, comprising two plasma beam sources creating a shared magnetic field between the two sources.

16. A plasma processing apparatus, comprising;
an enclosure defining a cavity;
a nozzle extending outwardly from the cavity;
a power supply interconnected with said enclosure to render said enclosure a cathode electrode;
a cusp magnetic field defining a magnetic field null region disposed within the cavity;
said cusp magnetic field comprising a first portion and a second portion, said first portion creating a closed drift electron magnetron confinement region within the cavity;
said second portion producing a mirror confinement region passing through and out of said cavity through the nozzle, whereby a plasma generated in the cavity is directed from the cavity through the nozzle; and
a monomer gas outside the cavity that is reactive with the plasma directed from the cavity.

17. A method for treating a substrate with a plasma beam, comprising the steps of:
providing a process chamber;
locating within the process chamber a plasma beam source comprising a discharge cavity having a first width, a nozzle extending outwardly from the discharge cavity the nozzle having a second width which is less than the first width; a plurality of magnets disposed adjacent to and external of the discharge cavity, said magnets creating at least one magnetron confinement region within said discharge cavity; and, a conduit, other than the nozzle, for introducing an ionizable gas into the discharge cavity;
placing the substrate within the process chamber and external to the plasma beam source;
introducing an ionizable gas into the discharge cavity through the conduit;
igniting a plasma within the magnetron confinement region;
projecting the plasma through the nozzle and onto the substrate.

18. Apparatus for producing a plasma stream, said apparatus comprising in combination:
(1) a discharge cavity containing at least one magnetron cathode for generating electrons; and
(2) magnets disposed exterior of said discharge cavity generally facing one another for creating a cusp magnetic field within said discharge cavity and having a null region.

19. A method for producing a plasma stream, said method comprising the steps of:
(1) generating electrons in a discharge cavity containing at least one magnetron cathode; and
(2) creating a magnetic field within the discharge cavity having a null region with magnets external of the discharge cavity and facing one another.

20. A source of plasma, said source comprising in combination:
(a) a discharge cavity containing at least one magnetron cathode for generating electrons, said discharge cavity having a first width;
(b) magnets disposed exterior of said discharge cavity for creating a magnetic field within said discharge cavity and having a null region;
(c) a nozzle for providing a conduit for electron flow from said discharge cavity, said nozzle having a second width less than the first width; and
(d) an inlet other than said nozzle for introducing an ionizable gas into said discharge cavity.

21. The source of plasma as set forth in claim 20, wherein the ionizable gas inlet is located between said at least one cathode and said nozzle within said discharge cavity.

22. The source of plasma as set forth in claim 20, wherein the magnetic field includes three axial magnetic field regions, wherein two of the three axial magnetic field regions adjacent to the null region pass through said cathode and wherein the third axial magnetic field region comprises a mirror confinement region emanating through said nozzle.

23. The source of plasma as set forth in claim 20, including:
(e) a power supply selected from the group consisting of AC power, DC power and RF power.

24. The source of plasma as set forth in claim 23, including:
(f) an additional discharge cavity containing at least one magnetron cathode for generating electrons, said additional discharge cavity having a first width;
(g) additional magnets disposed exterior of said additional discharge cavity for creating a magnetic field within said additional discharge cavity and having an additional null region;
(h) an additional nozzle for providing a conduit for electron flow from said additional discharge cavity, said additional nozzle having a second width less than the first width of the additional discharge cavity; and
(i) an additional conduit other than said additional nozzle for introducing an additional ionizable gas into said additional discharge cavity.

25. A method for creating a source of plasma, said method comprising the steps of:
(1) generating electrons in a discharge cavity containing at least one magnetic cathode, the discharge cavity having a first width;
(2) creating a magnetic field within the discharge cavity with magnets disposed external of the discharge cavity, which magnetic field includes a null region;
(3) providing a conduit for electron flow from the discharge cavity through a nozzle having a second width less than the first width; and
(4) introducing an ionizable gas into the discharge cavity through an inlet other than said nozzle to produce a discharge of plasma containing electrons and the ionizable gas through the nozzle.

26. The method as set forth in claim 25, wherein the magnetic field includes three axial magnetic field regions wherein two of the three axial magnetic field regions adjacent to the null region pass through the cathode and wherein the third axial magnetic field region comprises a mirror confinement region emanating through the nozzle.

27. The method as set forth in claim 25, including the steps of:
(5) generating electrons in an additional discharge cavity containing at least one additional magnetron cathode, the additional discharge cavity having a third width;
(6) creating an additional magnetic field within the additional discharge cavity with additional magnets disposed external of the additional discharge cavity, which additional magnetic field includes an additional null region;

(7) providing an additional conduit for electron flow from the additional discharge cavity through an additional nozzle having a fourth width less than the third width; and (8) introducing an additional ionizable gas into the additional discharge cavity through an inlet other than said additional nozzle to produce an additional discharge of plasma containing electrons and the additional ionizable gas through the additional nozzle.

* * * * *